(12) United States Patent
Li et al.

(10) Patent No.: US 10,101,419 B2
(45) Date of Patent: Oct. 16, 2018

(54) MAGNETIC RESONANCE IMAGING APPARATUS AND LOCAL COIL ASSEMBLY AND LOCAL COIL THEREOF

(71) Applicants: Wen Ming Li, Shenzhen (CN); Tong Tong, Shenzhen (CN); JianMin Wang, Shenzhen (CN)

(72) Inventors: Wen Ming Li, Shenzhen (CN); Tong Tong, Shenzhen (CN); JianMin Wang, Shenzhen (CN)

(73) Assignee: Siemens Aktiengesellschaft, München (DE)

( * ) Notice: Subject to any disclaimer, the term of this patent is extended or adjusted under 35 U.S.C. 154(b) by 576 days.

(21) Appl. No.: 14/458,823

(22) Filed: Aug. 13, 2014

(65) Prior Publication Data

US 2015/0048831 A1 Feb. 19, 2015

(30) Foreign Application Priority Data

Aug. 14, 2013 (CN) .......................... 2013 2 0496567

(51) Int. Cl.
*G01R 33/36* (2006.01)
*G01R 33/3415* (2006.01)

(52) U.S. Cl.
CPC ...... *G01R 33/3664* (2013.01); *G01R 33/3415* (2013.01); *G01R 33/3621* (2013.01)

(58) Field of Classification Search
CPC ............ G01R 33/3664; G01R 33/3415; G01R 33/3621

See application file for complete search history.

(56) References Cited

U.S. PATENT DOCUMENTS

| | | | | |
|---|---|---|---|---|
| 5,361,765 | A | * 11/1994 | Herlihy | A61B 5/0555 324/318 |
| 2008/0211502 | A1 | * 9/2008 | Arnold | G01R 33/3415 324/318 |
| 2014/0197833 | A1 | * 7/2014 | Ryu | G01R 33/288 324/309 |

\* cited by examiner

*Primary Examiner* — Rodney Bonnette
(74) *Attorney, Agent, or Firm* — Lempia Summerfield Katz LLC

(57) ABSTRACT

A local coil assembly for an MRI apparatus includes an RF channel setting unit, a basic coil having a first slot, and a first additional coil connected to the first slot. Each of the basic coil and the first additional coil includes one or more receiving channels. The RF channel setting unit is configured for setting a receiving channel of the basic coil and a receiving channel of the first additional coil. The basic coil is configured for receiving an RF signal according to a receiving channel set by the RF channel setting unit. The first additional coil is configured for receiving an RF signal according to a receiving channel set by the RF receiving channel setting unit. The present teachings are compatible with multiple coils, and support the combined use of multiple coils.

10 Claims, 4 Drawing Sheets

MAGNETIC RESONANCE IMAGING APPARATUS AND LOCAL COIL ASSEMBLY AND LOCAL COIL THEREOF

RELATED APPLICATIONS

This application claims the benefit of Chinese Patent Application No. CN 201320496567.3, filed Aug. 14, 2013. The entire contents of the priority document are hereby incorporated herein by reference.

TECHNICAL FIELD

The present teachings relate generally to the field of magnetic resonance and, in some embodiments, to magnetic resonance imaging apparatuses, and to local coil assemblies and local coils thereof.

BACKGROUND

Magnetic resonance imaging (MRI) is an imaging technology that involves biomagnetism and nuclear spin. MRI has grown rapidly with the development of computer technology, electronic circuit technology, and superconductor technology. MRI uses a magnetic field and radio frequency (RF) pulses to cause nutation of precessing hydrogen nuclei (e.g., $H^+$) in human tissue, thereby generating RF signals that are processed by a computer to form an image. When an object is placed in the magnetic field and irradiated with appropriate electromagnetic waves to make the object resonate, and upon analysis of the electromagnetic waves released thereby, the positions and types of the atomic nuclei that form the object may be identified. As a result, a precise three-dimensional image of the interior of the object may be drawn. For example, MRI may be used to scan a human brain to obtain a moving image of contiguous slices beginning at the top of the head and going all the way to the base of the head.

In conventional magnetic resonance systems, one system slot may support only one coil. Early magnetic resonance systems were configured with only a few slots. At present, the number of slots is insufficient for advanced later-developed applications such as full-body matrix imaging.

Heretofore, the method used to make a system compatible with multiple coils has been to increase the number of slots in the system. However, increasing the number of system slots may result in changes to the patient table, system cables, and receiver. These changes may significantly increase the cost of the system. Moreover, when the number of system slots in the original system is insufficient, upgrading the system to include multiple slots is difficult. Another approach has been to utilize control bus technology to send an upper-level command to a decoder that then controls switching of the appropriate RF channel according to the content of the command. When the control bus method is used, software is used for alterations and a corresponding control line in the cable is used. In addition, a clock signal is introduced that may cause interference to the system.

SUMMARY AND DESCRIPTION

The scope of the present invention is defined solely by the appended claims, and is not affected to any degree by the statements within this summary.

The present embodiments may obviate one or more of the drawbacks or limitations in the related art. For example, in some embodiments, a local coil assembly of an MRI apparatus that facilitates compatibility with multiple coils is provided.

In some embodiments, an MRI apparatus that facilitates compatibility with multiple coils is provided.

In some embodiments, a local coil of an MRI apparatus that facilitates compatibility with multiple coils is provided.

A local coil assembly for an MRI apparatus in accordance with the present teachings includes an RF channel setting unit, a basic coil, and a first additional coil. Each of the basic coil and the first additional coil includes one or more receiving channels. The RF receiving channel setting unit is configured for setting a receiving channel of the basic coil and a receiving channel of the first additional coil. The basic coil is configured for receiving an RF signal according to a receiving channel set by the RF receiving channel setting unit. The basic coil is provided with a first slot, and the first additional coil is connected to the first slot. The first additional coil is configured for receiving an RF signal according to a receiving channel set by the RF receiving channel setting unit.

The RF channel setting unit is configured for enabling (e.g., activating) all or some of the receiving channels of the basic coil and all or some of the receiving channels of the first additional coil, or for disabling (e.g., deactivating) all or some of the receiving channels of the basic coil and all or some of the receiving channels of the first additional coil.

In some embodiments, the local coil assembly for an MRI apparatus further includes a second additional coil. The basic coil is further provided with a second slot, and the second additional coil is connected to the second slot. The RF channel setting unit is further configured for setting a receiving channel of the second additional coil. The second additional coil is configured for receiving an RF signal according to a receiving channel set by the RF channel setting unit.

In some embodiments, the local coil assembly for an MRI apparatus further includes a third additional coil. The basic coil is further provided with a third slot, and the third additional coil being connected to the third slot. The RF channel setting unit is further configured for setting a receiving channel of the third additional coil. The third additional coil is configured for receiving an RF signal according to a receiving channel set by the RF channel setting unit.

In some embodiments, the local coil assembly for an MRI apparatus further includes a fourth additional coil. The basic coil is further provided with a fourth slot, and the fourth additional coil is connected to the fourth slot. The RF channel setting unit is further configured for setting a receiving channel of the fourth additional coil. The fourth additional coil is configured for receiving an RF signal according to a receiving channel set by the RF channel setting unit.

The basic coil is a head/neck coil including an upper half part and a lower half part. The first slot and the second slot are arranged on two opposite sides of the lower half part. The basic coil is a head coil, a neck coil, a head/neck coil, a body coil, a limb coil, a shoulder coil, a spine coil, a large/small flexible coil, or an ankle coil.

The first additional coil is a large/small flexible coil, a body coil, a limb coil, a shoulder coil, an ankle coil, or a spine coil.

In some embodiments, the local coil assembly for an MRI apparatus further includes an output unit configured for outputting an RF signal. The output RF signal is configured to be received by a receiving channel set by the RF channel setting unit. The output unit is an output cable connected to a receiver.

An MRI apparatus in accordance with the present teachings includes a magnetic resonance coil assembly of a type described above.

A local coil of an MRI apparatus in accordance with the present teachings, includes an RF channel setting unit and a basic coil having a slot. The slot is configured for connecting to an additional local coil. The RF receiving channel setting unit is configured for setting a receiving channel of the basic coil and a receiving channel of the additional local coil.

The basic coil is a head coil, a neck coil, a head/neck coil, a body coil, a limb coil, a shoulder coil, a spine coil, a large/small flexible coil, or an ankle coil.

The local coil of an MRI apparatus in accordance with the present teachings includes an RF channel setting unit, a basic coil, and a first additional coil. The basic coil is provided with a first slot, and the first additional coil is connected to the first slot. The RF channel setting unit is configured for setting a receiving channel of the basic coil and a receiving channel of the first additional coil. The basic coil is configured for receiving an RF signal corresponding to a receiving position of the basic coil according to a receiving channel set by the RF channel setting unit. The first receiving coil is configured for receiving an RF signal corresponding to a receiving position of the first receiving coil according to a receiving channel set by the RF channel setting unit. The present teachings are compatible with multiple coils, thereby reducing costs, and support the combined use of multiple coils. As such, the present teachings may be beneficial for use in advanced applications, such as full-body matrix imaging.

DETAILED DESCRIPTION

Representative embodiments will now be described in reference to the accompanying drawings. These representative embodiments are merely illustrative of the present teachings and do not define the scope of the present invention.

Figure 1:
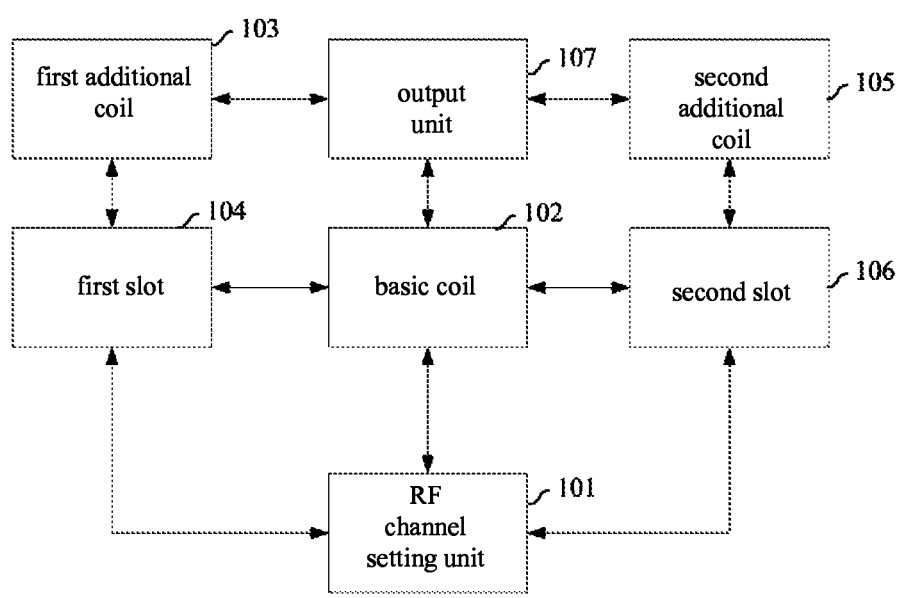
FIG. 1 shows a schematic illustration of an example of a local coil assembly of an MRI apparatus in accordance with the present teachings.

FIG. 1 is a schematic illustration of a local coil assembly of an MRI apparatus in accordance with the present teachings. As shown in FIG. 1, the magnetic resonance coil assembly includes an RF channel setting unit 101, a basic coil 102, and a first additional coil 103. The basic coil 102 is provided with a first slot 104. The first additional coil 103 is connected to the first slot 104. Each of the basic coil 102 and the first additional coil 103 includes one or more receiving channels.

The RF channel setting unit 101 is configured for setting a receiving channel of the basic coil 102 and a receiving channel of the first additional coil 103. The basic coil 102 is configured for receiving an RF signal corresponding to a receiving position of the basic coil according to a receiving channel set by the RF channel setting unit 101.

The first additional coil 103 is configured for receiving an RF signal corresponding to a receiving position of the first additional coil according to a receiving channel set by the RF channel setting unit 101. Each of the basic coil 102 and the first additional coil 103 may have multiple receiving units. Each of the multiple receiving units may correspond to one receiving channel configured for receiving a human body RF signal. By enabling receiving units included in the basic coil 102 and the first additional coil 103, the RF channel setting unit 101 may open and enable corresponding receiving channels in the basic coil 102 and the first additional coil 103. By disabling receiving units included in the basic coil 102 and the first additional coil 103, the RF channel setting unit 101 may close corresponding receiving channels in the basic coil 102 and the first additional coil 103. The basic coil 102 sends received RF signals to an MRI apparatus.

Moreover, a plurality of receiving units may provide a receiving unit group. The RF channel setting unit 101 may use a receiving unit group as the unit of control when setting receiving channels of the basic coil 102 and the first additional coil 103.

In some embodiments, the RF channel setting unit 101 is configured for enabling all or some of the receiving channels of the basic coil 102 and all or some of the receiving channels of the first additional coil 103, or for disabling all or some of the receiving channels of the basic coil 102 and all or some of the receiving channels of the first additional coil 103.

The basic coil 102 is configured for receiving an RF signal corresponding to a receiving position of the basic coil according to a receiving channel set by the RF channel setting unit 101. The first additional coil 103 is configured for receiving an RF signal corresponding to a receiving position of the first additional coil according to a receiving channel set by the RF channel setting unit 101.

In some embodiments, the basic coil 102 may be a head coil, a neck coil, a head/neck coil, a body coil, a limb coil, a shoulder coil, a spine coil, a large/small flexible coil, an ankle coil, or the like. In some embodiments, the basic coil 102 may be a head coil, a neck coil, or a head/neck coil.

In some embodiments, the first additional coil 103 may be a large/small flexible coil, a body coil, a limb coil, a shoulder coil, an ankle coil, a spine coil, or the like. For example, when the first additional coil 103 is a body coil, a body RF signal is received according to a receiving channel set by the RF channel setting unit 101. When the first receiving coil 103 is a spine coil, a spine RF signal is received according to a receiving channel set by the RF channel setting unit 101.

In some embodiments, the magnetic resonance basic coil 102 further includes a second additional coil 105. The second additional coil 105 may include one or more receiving channels. The basic coil 102 is further provided with a second slot 106, and the second additional coil 105 is connected to the second slot 106. The RF channel setting unit 101 is further configured for setting a receiving channel of the second additional coil 105. The second additional coil 105 is configured for receiving an RF signal corresponding to a receiving position of the second additional coil according to a receiving channel set by the RF channel setting unit 101.

In some embodiments, the basic coil 102 is a head/neck coil and includes an upper half part and a lower half part.

The head/neck coil may have an integral head/neck structure. The head/neck coil itself may also have two output cables configured for outputting RF signals received by the whole head/neck coil assembly to a system-receiving end. The lower half part of the coil is configured with two slots identical to the system slots, such as a first slot 104 and a second slot 106, to facilitate connection of other coils to the system via the head/neck coil.

In some embodiments, the magnetic resonance basic coil 102 further includes a third additional coil. The third additional coil may include one or more receiving channels. The basic coil 102 is further provided with a third slot, and the third additional coil is connected to the third slot. The RF channel setting unit 101 is further configured for setting a receiving channel of the third additional coil. The third additional coil is configured for receiving an RF signal corresponding to a receiving position of the third additional coil according to a receiving channel set by the RF channel setting unit 101.

In some embodiments, the magnetic resonance basic coil 102 further includes a fourth additional coil. The fourth additional coil may include one or more receiving channels. The basic coil 102 is further provided with a fourth slot, and the fourth additional coil is connected to the fourth slot. The RF channel setting unit 101 is further configured for setting a receiving channel of the fourth additional coil. The fourth additional coil is configured for receiving an RF signal corresponding to a receiving position of the fourth additional coil according to a receiving channel set by the RF channel setting unit 101.

Examples of a basic coil provided with 2, 3, or 4 expansion coils have been described above. However, the present teachings are not restricted in terms of the number of expansion slots on the head/neck coil. Any number of such slots may be used.

In addition, the additional coil on each expansion slot may be a receiving coil corresponding to any part (e.g., a large/small flexible coil, a limb coil, a shoulder coil, an ankle coil, a body coil, a spine coil, etc.). The present teachings are not restricted in terms of the type of part.

In some embodiments, the magnetic resonance coil assembly further includes an output unit 107. The output unit 107 is configured for outputting an RF signal received by a receiving channel set by the RF channel setting unit 101. The output unit may output received RF signals according to the number of receiving channels in the system. For example, the output unit 107 may output RF signals received by the whole magnetic resonance coil assembly (e.g., including the basic coil 102, the first additional coil 103, the second additional coil 104, etc.) according to receiving channels set by the RF channel setting unit.

The present teachings may be used to increase the number of RF channels in a magnetic resonance system without changing hardware. The slots corresponding to the basic coil are compatible with multiple coils. There is no need to define a complex communication protocol. Rather, switching of the various RF channels may be achieved using the tuning/detuning control line intrinsic to the system. Moreover, in accordance with the present teachings, an operator may readily position multiple coils in a single operation. Thus, the present teachings may provide a benefit in advanced applications such as full-body matrix imaging.

In some embodiments, the present teachings provide a magnetic resonance coil. The magnetic resonance coil includes an RF channel setting unit, a basic coil, and a slot located on the basic coil that is configured for receiving an additional local coil. The RF channel setting unit is configured for setting a receiving channel of the basic coil and a receiving channel of the additional local coil.

A magnetic resonance coil in accordance with the present teachings may be used to expand one or more slots, and may be a head coil, a neck coil, a head/neck coil, a body coil, a limb coil, a shoulder coil, a spine coil, a large/small flexible coil, an ankle coil, or the like.

Figure 2:
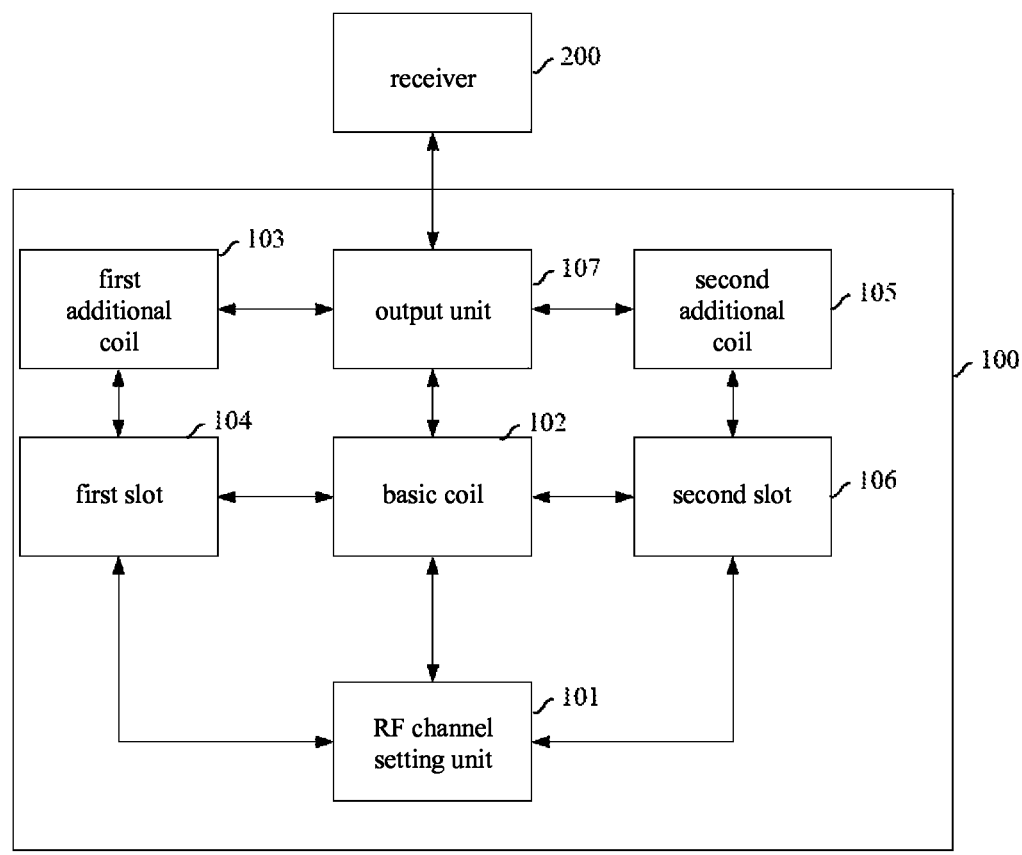
FIG. 2 shows a schematic illustration of an example of an MRI apparatus in accordance with the present teachings.

In some embodiments, the present teachings provide an MRI apparatus. FIG. 2 shows a schematic illustration of an example of an MRI apparatus in accordance with the present teachings.

As shown in FIG. 2, the apparatus includes a coil assembly 100 and a receiver 200. The coil assembly 100 includes an RF channel setting unit 101, a basic coil 102, a first additional coil 103, and an output unit 107. The basic coil 102 is provided with a first slot 104. The first additional coil 103 is connected to the first slot 104. The RF channel setting unit 101 is configured for setting a receiving channel of the basic coil 102 and a receiving channel of the first additional coil 103. The basic coil 102 is configured for receiving an RF signal corresponding to a receiving position of the basic coil according to a receiving channel set by the RF channel setting unit 101. The first additional coil 103 is configured for receiving an RF signal corresponding to a receiving position of the first additional coil according to a receiving channel set by the RF channel setting unit 101.

The output unit 107 is configured for outputting an RF signal. The output RF signal is configured to be received by a receiving channel set by the RF channel setting unit. The receiver 200 is configured for receiving an RF signal from the output unit.

In some embodiments, the coil assembly 100 further includes a second additional coil 105. The basic coil 102 is further provided with a second slot 106, and the second additional coil 105 is connected to the second slot 106. The RF channel setting unit 101 is further configured for setting a receiving channel of the second additional coil 105. The second additional coil 105 is configured for receiving an RF signal corresponding to the receiving position of the second additional coil 105 according to a receiving channel set by the RF channel setting unit 101.

The RF channel setting unit 101 may be built into the basic coil 102. Alternatively, the RF channel setting unit 101 may be a separate entity from the basic coil 102.

The present teachings may implement combined use of more than one type of coil (e.g., by configuring the basic coil with a plurality of slots and locating the RF channel setting unit inside the basic coil).

An example of a basic coil configured as a head/neck coil is described below.

Figure 3:
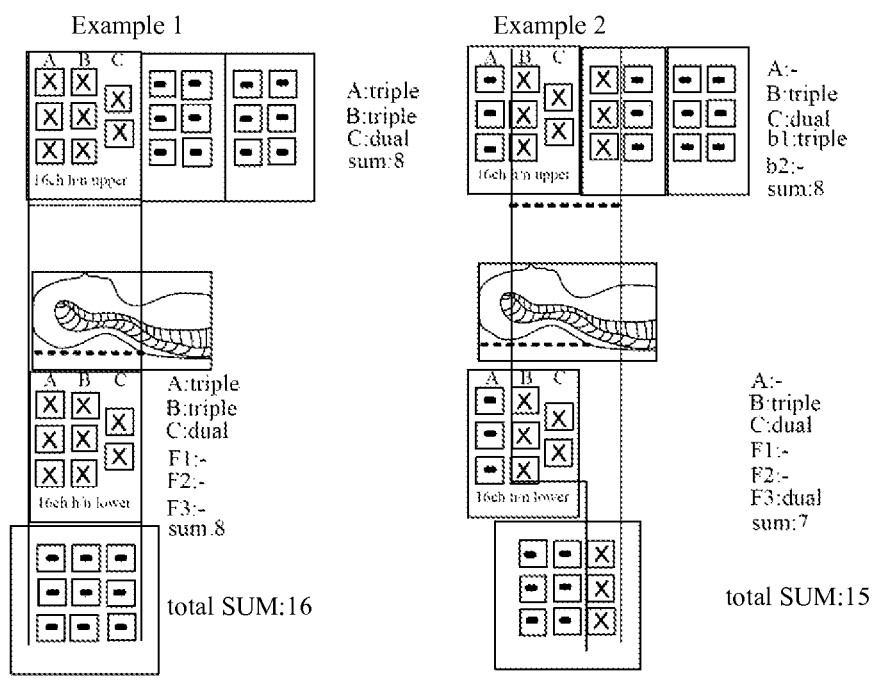
FIG. 3 shows a schematic illustration of an example of a magnetic resonance head/neck coil and body coil being used together in accordance with the present teachings.

FIG. 3 shows a schematic illustration of an example of a magnetic resonance head/neck coil, body coil, and spine coil being used together in accordance with the present teachings.

As shown in FIG. 3, two 6-channel flexible body coils are connected to two slots, respectively, of a head/neck coil. The configuration shown in FIG. 3 facilitates separate use of the head/neck coil and the body coils. Moreover, the configuration in FIG. 3 is suitable for combined use of the head/neck coil and the body coils, and of both body coils. Moreover, combined use of the head/neck coil, body coils, and spine coil is similarly supported.

As an example, the number of receiving channels supported by the system may be 16. In example 1 shown to the left in FIG. 3, the receiving channels of the head/neck coil set by the RF channel setting unit are an upper part and a lower part. Each of the upper part and the lower part has 3 receiving groups. Group A has 3 units, group B has 3 units, and group C has 2 units, thereby providing a total of 16 units. Thus, in example 1 in FIG. 3, the 16 units of the head/neck coil occupy all of the receiving channels.

In example 2 shown to the right in FIG. 3, the receiving channels of the head/neck coil set by the RF channel setting unit are an upper part and a lower part. Each of the upper part and the lower part has 2 receiving groups. Group B has 3 units and group C has 2 units, thereby providing a total of 10 units. Moreover, the number of receiving channels of the body coil set by the RF channel setting unit is 3, and the number of receiving channels of the spine coil is 2. Thus, in example 2 in FIG. 3, the 10 units of the head/neck coil, the 3 units of the body coil, and the 2 units of the spine coil occupy different receiving channels, thereby providing a total of 15 receiving channels.

Figure 4:
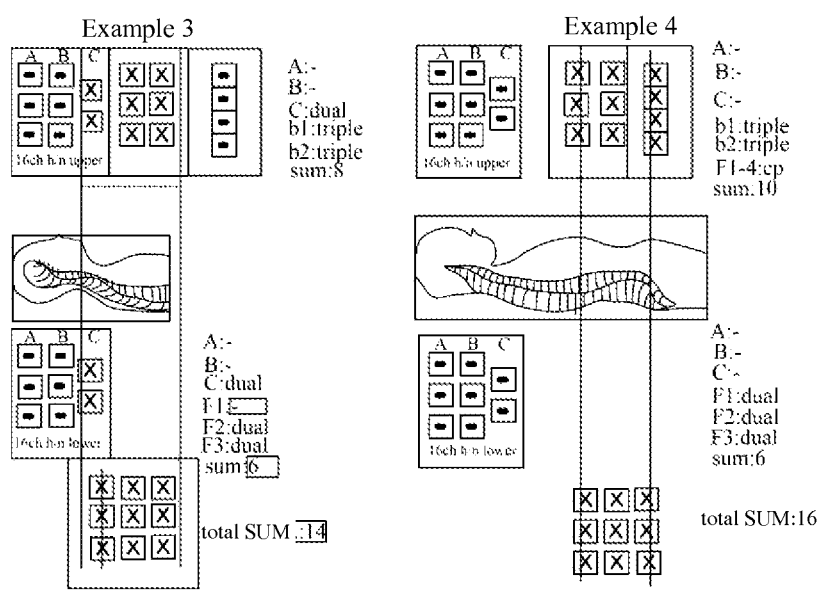
FIG. 4 shows a schematic illustration of an example of a magnetic resonance head/neck coil and body coil, and a large/small flexible coil and spine coil being used together in accordance with the present teachings.

FIG. 4 shows a schematic illustration of an example of a magnetic resonance head/neck coil and body coil, and a large/small flexible coil and spine coil being used together in accordance with the present teachings.

As shown in FIG. 4, a 6-channel flexible body coil and a 4-channel large/small flexible coil are connected to two slots of a head/neck coil, respectively. This configuration allows separate use of the head/neck coil, body coil, and large/small flexible coil. In addition, this configuration is suitable for combined use of the head/neck coil and body coil, the head/neck coil and large/small flexible coil, and the body coil and large/small flexible coil. Moreover, combined use of the head/neck coil, body coil, and large/small flexible coil with a spine coil is similarly supported.

In example 3 shown to the left in FIG. 4, the receiving channels of the head/neck coil set by the RF channel setting unit are an upper part and a lower part. Each of the upper part and the lower part has 1 receiving group (e.g., group C with 2 units, thereby providing a total of 4 units). Moreover, the number of receiving channels of the body coil set by the RF channel setting unit is 6, and the number of receiving channels of the spine coil is 4. Thus, in example 3 in FIG. 4, the number of receiving channels of the head/neck coil is 4, the number of receiving channels of the body coil is 6, and the number of receiving channels of the spine coil is 4 (e.g., a total of 14 receiving channels).

In example 4 shown to the right in FIG. 4, the number of receiving channels of the head/neck coil set by the RF channel setting unit is 0. The number of receiving channels of the body coil set by the RF channel setting unit is 6, the number of receiving channels of the large/small flexible coil set by the RF channel setting unit is 4, and the number of receiving channels of the spine coil is 6. Thus, in example 4 in FIG. 4, the number of receiving channels of the body coil is 6, the number of receiving channels of the large/small flexible coil is 4, and the number of receiving channels of the spine coil is 6. Thus, the sum of all of the receiving channels is 16.

In summary, a magnetic resonance coil in accordance with the present teachings includes an RF channel setting unit, a basic coil, and a first receiving coil. The basic coil is provided with a first slot. The first receiving coil is connected to the first slot. The RF channel setting unit is configured for setting a receiving channel of the basic coil and a receiving channel of the first receiving coil. The basic coil is configured for receiving an RF signal corresponding to a receiving position of the basic coil according to a receiving channel set by the RF channel setting unit. The first receiving coil is configured for receiving an RF signal corresponding to a receiving position of the first receiving coil according to a receiving channel set by the RF channel setting unit. The present teachings are compatible with multiple coils, thereby reducing costs, and support combined use of multiple coils. As such, the present teachings may be beneficial in advanced applications (e.g., full-body matrix imaging).

While the present invention has been described above by reference to various embodiments, it should be understood that many changes and modifications may be made to the described embodiments. It is therefore intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding claim—whether independent or dependent—and that such new combinations are to be understood as forming a part of the present specification.

The invention claimed is:

1. A local coil assembly for an MRI apparatus, the local coil assembly comprising:
    an RF channel setting unit;
    a basic coil comprising a first slot and a second slot, wherein the basic coil is a local coil comprising a head/neck coil;
    a first additional coil connected to the first slot, wherein the first additional coil is a local coil comprising a large/small flexible coil, a body coil, a limb coil, a shoulder coil, an ankle coil, or a spine coil; and
    a second additional coil connected to the second slot;
    wherein the basic coil and the first additional coil are local coils;
    wherein each of the basic coil and the first additional coil comprises one or more receiving channels;
    wherein the RF channel setting unit is configured for setting a receiving channel of the basic coil, a receiving channel of the first additional coil, and a receiving channel of the second additional coil;
    wherein the basic coil is configured for receiving an RF signal on a receiving channel set by the RF channel setting unit;
    wherein the first additional coil is configured for receiving an RF signal on a receiving channel set by the RF channel setting unit;
    wherein the second additional coil is configured for receiving an RF signal on a receiving channel set by the RF channel setting unit;
    wherein the basic coil comprises an upper half and a lower half; and
    wherein the first slot and the second slot are arranged on opposite sides of the lower half of the basic coil.

2. The local coil assembly of claim 1, wherein the RF channel setting unit is further configured for activating or deactivating one or more receiving channels of the basic coil, and wherein the RF channel setting unit is further configured for activating or deactivating one or more receiving channels of the first additional coil.

3. The local coil assembly of claim 2, further comprising:
    an output unit configured for outputting an RF signal;
    wherein the output RF signal is configured to be received by a receiving channel set by the RF channel setting unit.

4. The local coil assembly of claim 1, further comprising:
a third additional coil;
wherein the basic coil further comprises a third slot;
wherein the third additional coil is connected to the third slot;
wherein the RF channel setting unit is further configured for setting a receiving channel of the third additional coil; and
wherein the third additional coil is configured for receiving an RF signal on a receiving channel set by the RF channel setting unit.

5. The local coil assembly of claim 4, further comprising:
an output unit configured for outputting an RF signal;
wherein the output RF signal is configured to be received by a receiving channel set by the RF channel setting unit.

6. The local coil assembly of claim 4, further comprising:
a fourth additional coil;
wherein the basic coil further comprises a fourth slot;
wherein the fourth additional coil is connected to the fourth slot;
wherein the RF channel setting unit is further configured for setting a receiving channel of the fourth additional coil; and
wherein the fourth additional coil is configured for receiving an RF signal on a receiving channel set by the RF channel setting unit.

7. The local coil assembly of claim 6, further comprising:
an output unit configured for outputting an RF signal;
wherein the output RF signal is configured to be received by a receiving channel set by the RF channel setting unit.

8. The local coil assembly of claim 1, further comprising:
an output unit configured for outputting an RF signal;
wherein the output RF signal is configured to be received by a receiving channel set by the RF channel setting unit.

9. The local coil assembly of claim 8, wherein the output unit comprises an output cable connected to a receiver.

10. An MRI apparatus, comprising:
a magnetic resonance coil assembly comprising:
an RF channel setting unit;
a basic coil comprising a first slot and a second slot, wherein the basic coil is a local coil comprising a head/neck coil;
a first additional coil connected to the first slot, wherein the first additional coil is a local coil comprising a large/small flexible coil, a body coil, a limb coil, a shoulder coil, an ankle coil, or a spine coil; and
a second additional coil connected to the second slot;
wherein the basic coil and the first additional coil are local coils;
wherein each of the basic coil and the first additional coil comprises one or more receiving channels;
wherein the RF channel setting unit is configured for setting a receiving channel of the basic coil, a receiving channel of the first additional coil, and a receiving channel of the second additional coil;
wherein the basic coil is configured for receiving an RF signal on a receiving channel set by the RF channel setting unit;
wherein the first additional coil is configured for receiving an RF signal on a receiving channel set by the RF channel setting unit
wherein the second additional coil is configured for receiving an RF signal on a receiving channel set by the RF channel setting unit;
wherein the basic coil comprises an upper half and a lower half; and
wherein the first slot and the second slot are arranged on opposite sides of the lower half of the basic coil.

* * * * *